United States Patent
Tang

(10) Patent No.: US 8,005,565 B2
(45) Date of Patent: Aug. 23, 2011

(54) DRILLING SYSTEM AND METHOD

(75) Inventor: Wei-Der Tang, Taipei Hsien (TW)

(73) Assignee: Foxnum Technology Co., Ltd., Tu-Cheng, New Taipei (TW)

( * ) Notice: Subject to any disclaimer, the term of this patent is extended or adjusted under 35 U.S.C. 154(b) by 435 days.

(21) Appl. No.: 12/331,443

(22) Filed: Dec. 10, 2008

(65) Prior Publication Data

US 2010/0138029 A1 Jun. 3, 2010

(30) Foreign Application Priority Data

Nov. 28, 2008 (CN) .......................... 2008 1 0305849

(51) Int. Cl.
*G06F 19/00* (2011.01)
(52) U.S. Cl. ........................................ 700/159; 700/164
(58) Field of Classification Search .................. 700/159, 700/164, 160, 180, 183; 408/8, 13
See application file for complete search history.

(56) References Cited

U.S. PATENT DOCUMENTS

| | | | | |
|---|---|---|---|---|
| 4,715,108 A | * | 12/1987 | Sugiyama et al. | ............... 483/54 |
| 5,655,354 A | * | 8/1997 | Baker et al. | ...................... 53/474 |
| 6,462,570 B1 | * | 10/2002 | Price et al. | ............... 324/756.02 |
| 6,487,084 B1 | * | 11/2002 | Chu et al. | ...................... 361/762 |

* cited by examiner

*Primary Examiner* — Kidest Bahta
(74) *Attorney, Agent, or Firm* — Zhigang Ma

(57) ABSTRACT

A drilling system includes a controller, a human-machine interface, and a drilling device. The controller stores a drilling procedure and a startup mode module for the drilling procedure, and generates an information list which includes location information and corresponding procedure line number for each hole. The human-machine interface is configured for selecting the startup mode module for the drilling procedure, and for inputting a query information corresponding to the selected startup mode module. The controller invokes the corresponding procedure line according to the inputted query information to restart the drilling process to enable the drilling device to return to work.

9 Claims, 2 Drawing Sheets

DRILLING SYSTEM AND METHOD

BACKGROUND

1. Technical Field

The present disclosure relates to drilling systems and drilling methods and, particularly, to a drilling system and method for rapidly restarting a drilling process with help of a drilling procedure stored in the drilling system.

2. Description of Related Art

Drilling devices in a drilling system often have downtime owing to some malfunctions, such as having the wrong parameters set in a drilling process, or operator mistakes. For most existing drilling systems and methods, to restart the drilling process when malfunctioning have occurred requires that a drilling procedure in the drilling systems be recompiled from the beginning of the drilling process, which is time consuming and costly if drilling process is complicated and long.

What is needed, therefore, is to provide a drilling system and method that can overcome the aforementioned deficiencies.

BRIEF SUMMARY OF THE INVENTION

A drilling system for rapidly restarting a drilling process therein includes a drilling device for drilling holes in a substrate, a control device, and a human machine interface. The control device stores a drilling procedure and a startup mode module for the drilling procedure. The drilling procedure generates an information list including location information and procedure line number for each hole. The human machine interface configured for selecting the startup mode, and inputting query information for a corresponding hole corresponding to the selected startup mode. The control device invokes the corresponding procedure line according to the inputted query information and the location information to restart the drilling process to enable the drilling device to return to work.

DETAILED DESCRIPTION

Figure 1:
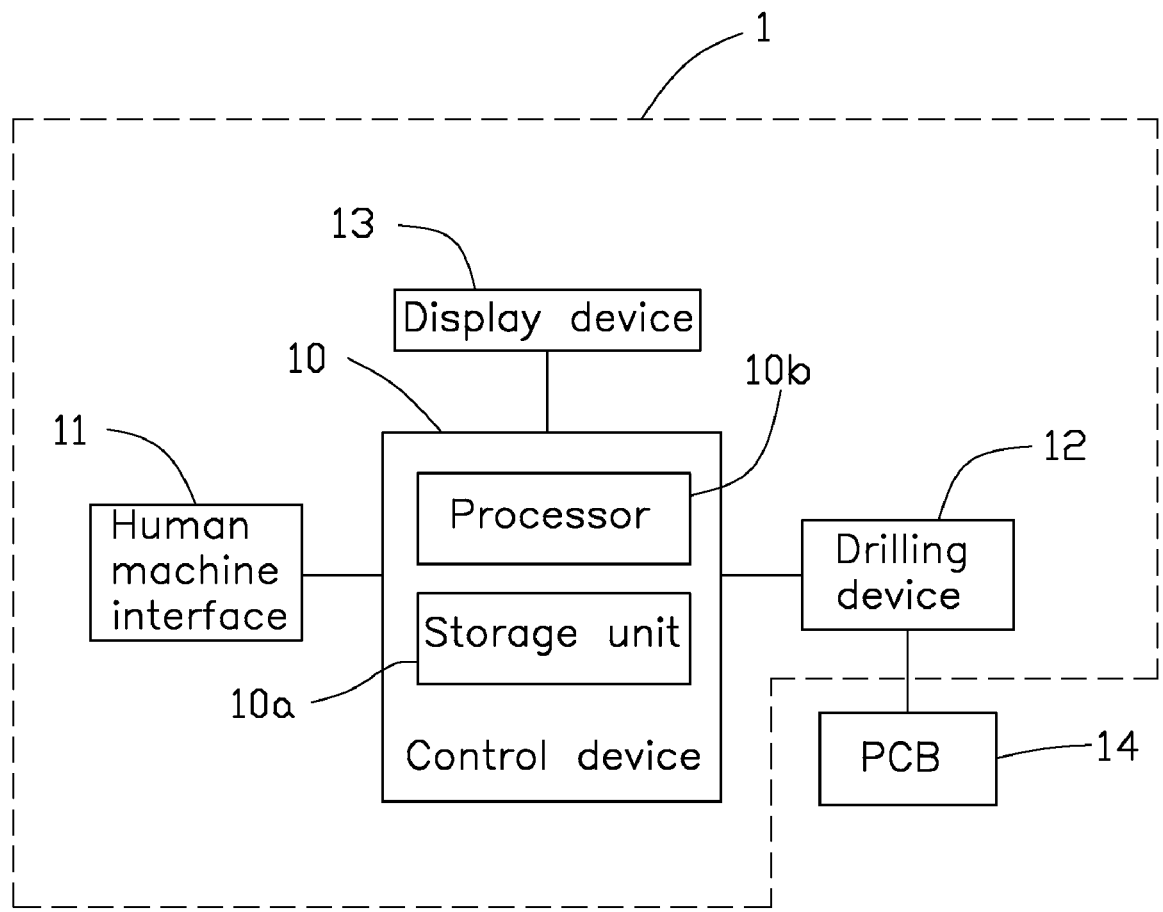
FIG. 1 is a step diagram of an exemplary embodiment of a drilling system for reducing the restarting time of a drilling process with help of a drilling procedure stored in the drilling system.

Referring to FIG. 1, an exemplary embodiment of a drilling system 1 for drilling holes in a substrate, such as a printed circuit board (PCB) 14, may include a control device 10, a human machine interface (HMI) 11 connected to the control device 10, and a drilling device 12 connected to the control device 10, and a display device 13 connected to the control device 10.

The control device 10 may include a storage unit 10a and a processor 10b. The storage unit 10a is configured for storing a drilling procedure and a startup mode module for the drilling procedure. The startup mode module includes a plurality of startup modes for the drilling procedure. In one embodiment, the startup mode module includes three startup modes for the drilling procedure, i.e., a hole number startup mode, a hole coordinate startup mode, and a start over or reset mode. Accordingly, there are three keys on the HMI 11, i.e., a hole number startup key, a hole coordinate startup key, and a process beginning startup key. It is understood that other startup modes can also be used for the drilling procedure. The drilling information for each hole in the PCB 14, such as hole number, hole coordinates, axis rotation speed, and drilling speed, is recorded in one or more lines of the drilling procedure. The processor 10b is configured for executing the drilling procedure, for controlling the drilling device 12 to drill holes in the PCB 14 according to the drilling procedure, and for generating an information list according to the drilling procedure. The information list includes location information of each hole and the number of the beginning procedure line that records the drilling information of each hole. The location information of a hole includes the number of the hole and the coordinates of the hole on the PCB 14, for example.

The HMI 11 is configured for selecting a startup mode for the drilling procedure, and for inputting a query information of a desired hole from where the drilling process returns to work according to the selected startup mode for the drilling procedure. In one embodiment, the query information of a hole is the number of the hole or the coordinates of the hole on the PCB 14. The display device 13 is configured for displaying the drilling information of a hole that the drilling device 12 is working at. Should the drilling device 12 stop working at a hole, such as the ninth hole, the display device 13 will hold onto the drilling information of the ninth hole. Additionally, if the drilling device 12 stops between after working at a hole and before staring another, such as in between the ninth hole and the tenth hole, the display device 13 will hold onto the drilling information of the ninth hole. Further details of the operation of the drilling system 1 will be explained below.

A drilling procedure is saved into the storage unit 10a. The processor 10b activates the drilling procedure to generate the information list, and to control the drilling device 12 to begin drilling holes in the PCB 14. If the drilling device 12 stops working at, e.g., the ninth hole owing to some malfunctioning, the display device 13 holds onto the drilling information of the ninth hole, such as the hole number "9", the hole coordinate (4, 5), and the drilling speed of the ninth hole 1.5 m/s.

Figure 2:
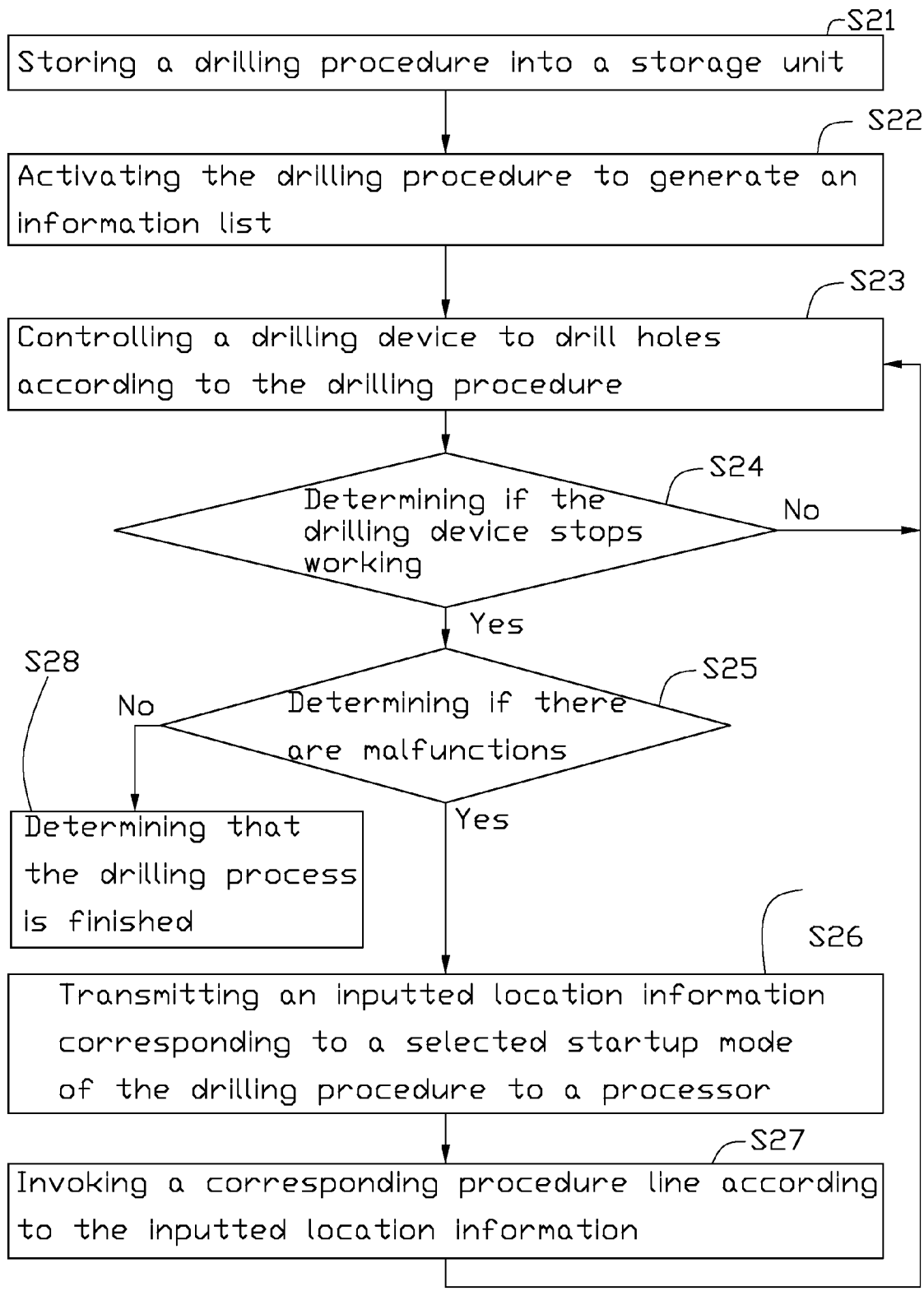
FIG. 2 is a flowchart of an exemplary embodiment of a drilling method for rapidly restarting a drilling process.

If it is desired that the drilling device 12 return to work at the ninth hole, a user may press the hole number startup key to select the hole number startup mode, and then inputting the number "9" (or any other hole number if you want to start from a different hole) through a dialog box on the HMI 11 to the processor 10b. The processor 10b compares the number "9" with every hole number in the information list. After finding the hole number "9" in the information list, the processor 10b uses the drilling information associated with that hole to restart the drilling process. For example, if the eleventh line of the drilling procedure is the beginning line that records the drilling information of the ninth hole, the processor 10b controls the drilling procedure to restart at the eleventh line to enable the drilling device 12 to continue working at the ninth hole. Another way to restart from the ninth hole is by pressing the hole coordinate startup key to select the hole coordinate startup mode, and then inputting the coordinates (4, 5) through two dialog boxes on the HMI 11 to the processor 10b. The processor 10b compares the coordinates (4, 5) with every hole coordinate in the information list. The subsequent operations corresponding to the hole coordinate startup mode are similar to the corresponding operations corresponding to the hole number startup mode. If it is desired to simply restart the process from the beginning, the start over or restart mode can be selected Referring to FIG. 2, an embodiment of a drilling method used for rapidly restarting a drilling process in the drilling system 1.

In step S21, a drilling procedure is stored into the storage unit 10a; one or more lines of the drilling procedure include a corresponding hole drilling information, such as, the number of the corresponding hole, the coordinates on the PCB 14 of the corresponding hole, the drilling speed of the corresponding hole, and so on; in one embodiment, the eleventh to the fifteenth lines, for example, of the drilling procedure record the drilling information of the ninth hole, such as the coordinate (4, 5), the drilling speed 1.5 m/s, and the hole number "9".

In step S22, the processor 10b activates the drilling procedure to generate an information list; the information list includes location information and corresponding procedure line number of each hole.

In step S23, the processor 10b controls the drilling device 12 to drill a hole in the PCB 14, such as the ninth hole, and the display unit 13 will display the drilling information of the ninth hole.

In step S24, the processor 10b determines if the drilling device 12 stops working; if the drilling device 12 stops working, the process continues to step S25, otherwise, the process returns to the step S23.

In step S25, the processor 10b determines if there are malfunctions; if there are malfunctions, the process continues to the step S26, otherwise, the process goes to step S28.

In step S26, a query information corresponding to a selected startup mode of the drilling procedure is transmitted to the processor 10b; the query information is a hole number when the hole number startup mode is selected, is a hole coordinate when the hole coordinate startup mode is selected, and is the number "1" when the start over or reset mode is selected.

In step S27, the processor 10b compares the query information with each location information in the information list, and then invokes the corresponding procedure line number from the information list to restart the drilling process at the corresponding procedure line, and the process returns to the step S23.

In step S28, the control device 10 determines that the drilling process on the PCB 14 is finished.

The foregoing description of the certain inventive embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skill in the art to which the present disclosure pertains without departing from its spirit and scope. Accordingly, the scope of the present disclosure is defined by the appended claims rather than the foregoing description and the embodiments described therein.

What is claimed is:

1. A drilling system for rapidly restarting a drilling process in the drilling system, the drilling system comprising:
   a drilling device for drilling holes in a substrate;
   a control device capable of storing a drilling procedure for the drilling process and a startup mode module, generating an information list according to the drilling procedure, and controlling the drilling device to drill holes in the plurality of substrate according to the drilling procedure, wherein the startup mode module is configured for providing a plurality of startup modes for the drilling procedure, the information list is configured for recording a location information and a corresponding procedure line number for each hole; the location information is configured for guiding the control device to invoke the corresponding procedure line number to restart the drilling process; and
   a human machine interface configured for selecting the startup mode for the drilling procedure, and inputting a query information for a corresponding hole corresponding to the selected startup mode,
   wherein the control device is capable of invoking the corresponding procedure line for the corresponding hole in response to the query information for the corresponding hole which is included the location information in the information list for the corresponding hole.

2. The drilling system of claim 1, wherein the control device comprises a storage unit and a processor; the storage unit is configured for storing the drilling procedure, and the startup mode module for the drilling process; the processor is configured for generating the information list, for invoking the corresponding procedure line for the corresponding hole, and for controlling the drilling device to drill holes.

3. The drilling system of claim 1, wherein the information list includes the location information and the corresponding procedure line number for each hole; the location information includes the hole number and the hole coordinate on the substrate.

4. The drilling system of claim 1, wherein the startup mode module includes a hole number startup mode, a hole coordinate startup mode, and a start over or reset mode.

5. The drilling system of claim 1, further comprising a display unit for displaying hole number and hole coordinates that the drilling device is working at.

6. The drilling system of claim 4, wherein the query information is the hole number in response to the selection of the hole number startup mode.

7. The drilling system of claim 4, wherein the query information is the hole coordinates in response to the selection of the hole coordinate startup mode.

8. The drilling system of claim 4, wherein the query information is the number 1 in response to the selection of the start over or reset mode.

9. A drilling method for rapidly restarting a drilling process in a drilling system having a processor, a storage unit, a human machine interface, a display unit and a drilling device, the drilling method comprising:
   storing a drilling procedure for the drilling process into the storage unit, wherein the drilling procedure includes drilling information of each hole;
   activating the drilling procedure to generate an information list, wherein the information list includes location information and corresponding procedure line number for each hole, the location information is configure for guiding the processor to invoke the corresponding procedure line number to restart the drilling process;
   controlling the drilling device to drill a corresponding hole according to the drilling procedure and displaying the drilling information of the corresponding hole;
   determining if the drilling device stops working due to malfunctioning;
   if the drilling device stops working due to malfunctioning, invoking the corresponding procedure line through the processor according to a query information corresponding to a selected startup mode for the drilling procedure;

restarting the drilling process according to the invoked corresponding procedure line; and controlling the drilling device to return to work according to the drilling procedure through the processor.

* * * * *